(12) United States Patent
Sato

(10) Patent No.: US 8,455,272 B2
(45) Date of Patent: Jun. 4, 2013

(54) METHOD FOR PRODUCING ORGANIC ELECTROLUMINESCENCE ELEMENT AND ORGANIC ELECTROLUMINESCENCE ELEMENT

(75) Inventor: Tasuku Sato, Ashigarakami-gun (JP)

(73) Assignee: UDC Ireland Limited, Dublin (IE)

( * ) Notice: Subject to any disclaimer, the term of this patent is extended or adjusted under 35 U.S.C. 154(b) by 181 days.

(21) Appl. No.: 12/695,772

(22) Filed: Jan. 28, 2010

(65) Prior Publication Data

US 2010/0200883 A1 Aug. 12, 2010

(30) Foreign Application Priority Data

Feb. 9, 2009 (JP) ................................ 2009-027605

(51) Int. Cl.
*H01L 21/00* (2006.01)

(52) U.S. Cl.
USPC ................................... 438/22; 438/29; 427/66

(58) Field of Classification Search
USPC ........................................ 438/22, 29; 427/66
See application file for complete search history.

(56) References Cited

U.S. PATENT DOCUMENTS

| | | | |
|---|---|---|---|
| 5,719,467 A | 2/1998 | Antoniadis et al. | |
| 6,087,196 A * | 7/2000 | Sturm et al. | 438/29 |
| 6,259,202 B1 * | 7/2001 | Sturm et al. | 313/504 |
| 6,423,429 B2 * | 7/2002 | Kido et al. | 428/690 |
| 6,566,156 B1 * | 5/2003 | Sturm et al. | 438/35 |
| 6,899,961 B2 * | 5/2005 | Morioka et al. | 428/690 |
| 7,053,547 B2 * | 5/2006 | Lu et al. | 313/506 |
| 7,090,890 B1 * | 8/2006 | Sturm et al. | 427/68 |
| 7,276,617 B2 * | 10/2007 | Sotoyama et al. | 556/35 |
| 7,399,536 B2 * | 7/2008 | Suh | 428/690 |
| 7,728,517 B2 * | 6/2010 | Aziz et al. | 313/506 |
| 7,879,461 B2 * | 2/2011 | Iida et al. | 428/690 |
| 8,252,432 B2 * | 8/2012 | Iida et al. | 428/690 |
| 2001/0006742 A1 * | 7/2001 | Morioka et al. | 428/690 |
| 2001/0046611 A1 * | 11/2001 | Kido et al. | 428/690 |
| 2004/0007969 A1 * | 1/2004 | Lu et al. | 313/501 |
| 2004/0150330 A1 * | 8/2004 | Suh | 313/506 |
| 2005/0029932 A1 | 2/2005 | Yang et al. | |
| 2005/0106419 A1 * | 5/2005 | Endoh et al. | 428/690 |
| 2005/0221125 A1 * | 10/2005 | Morioka et al. | 428/690 |
| 2006/0243966 A1 * | 11/2006 | Sotoyama et al. | 257/40 |
| 2007/0207341 A1 * | 9/2007 | Iida et al. | 428/690 |
| 2007/0296329 A1 * | 12/2007 | Sotoyama et al. | 313/504 |
| 2009/0066223 A1 | 3/2009 | Yabe et al. | |
| 2010/0200883 A1 * | 8/2010 | Sato | 257/98 |
| 2010/0273118 A1 | 10/2010 | Kagawa et al. | |
| 2011/0001134 A1 * | 1/2011 | Iida et al. | 257/40 |
| 2011/0108105 A1 * | 5/2011 | Dimer et al. | 136/256 |
| 2011/0215312 A1 | 9/2011 | Yabe et al. | |
| 2011/0266526 A1 * | 11/2011 | Ma et al. | 257/40 |
| 2011/0266950 A1 * | 11/2011 | Jenek et al. | 313/616 |
| 2011/0309346 A1 * | 12/2011 | Watanabe et al. | 257/40 |
| 2012/0086329 A1 * | 4/2012 | Dyatkin | 313/504 |
| 2012/0119190 A1 * | 5/2012 | Alleyne et al. | 257/40 |
| 2012/0181511 A1 * | 7/2012 | Ma et al. | 257/40 |
| 2012/0187381 A1 * | 7/2012 | Xia et al. | 257/40 |
| 2012/0256227 A1 * | 10/2012 | Tsurume et al. | 257/99 |

FOREIGN PATENT DOCUMENTS

| | | |
|---|---|---|
| JP | 07-142168 A | 6/1995 |
| JP | 9-45479 A | 2/1997 |
| JP | 10-255972 A1 | 9/1998 |
| JP | 2000-133064 A | 5/2000 |
| JP | 2000-150172 A | 5/2000 |
| JP | 2000-512795 A | 9/2000 |
| JP | 2006-257409 A | 9/2006 |
| JP | 2007142168 | 6/2007 |
| JP | 2008-181937 A | 8/2008 |
| JP | 2008181937 | 8/2008 |
| JP | 2008243421 | 10/2008 |
| WO | 97/48115 A1 | 12/1997 |
| WO | 2007061181 | 5/2007 |

OTHER PUBLICATIONS

"Non-polymeric OLEDs with a doped amorphous hole transport layer and operating voltages down to 3.2 V to achieve 100 cd/m2" Synthetic Metals 127 (2002) 189-173 (Blochwitz et al) (attached as NPL-OLED).*
Office Action dated May 1, 2012 on Japanese Application No. JP 2009-027605.
Notice for Reasons of Rejection for Japanese Patent Application 2009-027605, dated Oct. 9, 2012, 3 pages (in Japanese).
English translation of Notice for Reasons of Rejection for Japanese Patent Application 2009-027605, dated Oct. 9, 2012, 3 pages.

* cited by examiner

*Primary Examiner* — Laura Menz
(74) *Attorney, Agent, or Firm* — Morgan, Lewis & Bockius, LLP

(57) ABSTRACT

A method for producing an organic electroluminescence element, the method including subjecting an anode to a surface treatment using at least one non-oxidizing gas, and forming a p-doped hole-injection layer on a surface of the anode subjected to the surface treatment.

7 Claims, No Drawings

METHOD FOR PRODUCING ORGANIC ELECTROLUMINESCENCE ELEMENT AND ORGANIC ELECTROLUMINESCENCE ELEMENT

BACKGROUND OF THE INVENTION

1. Field of the Invention

The present invention relates to a method for producing an organic electroluminescence element and to an organic electroluminescence element produced by the method.

2. Description of the Related Art

In order for organic electroluminescence elements to be widely put into practical use, development has been demanded for a high-performance organic electroluminescence element whose drive voltage is low, whose service life is long, and whose durability is good.

In the production of an organic electroluminescence element, an electrode (e.g., an ITO film) constituting the organic electroluminescence element is generally subjected to surface treatment through oxygen plasma treatment or UV-ozone treatment. By virtue of this treatment, organic matter on the electrode is decomposed and washed away. As a result, no barrier with respect to HOMO level can be attained in an organic film on the electrode, leading to decrease in necessary drive voltage. Without surface treatment, stain on the electrode surface is not removed, potentially resulting in that sufficient durability cannot be obtained, for example, a short circuit occurs between the electrodes, and ununiform light emission is observed on a light-emitting surface.

However, when the electrode is subjected to surface treatment using oxygen, sufficient durability cannot be necessarily attained. In view of this, there is proposed surface treatment methods using oxygen-free gas such as argon gas (see Japanese Patent Application Laid-Open (JP-A) Nos. 2000-133064, 2000-512795 and 2000-150172).

For example, JP-A No. 2000-133064 discloses that, using an inert gas whose energy level falls within a range of 20 eV to 100 eV, an ITO film is irradiated with cations for surface modification.

Also, JP-A No. 2000-512795 discloses an electric device containing a semiconductive or conductive layer with a work function which is modified through a plasma treatment.

Also, JP-A No. 2000-150172 discloses that, in an organic EL display element having an organic illuminant-containing organic light-emitting layer between an anode and a cathode, at least one element selected from nitrogen, sulfur, selenium, tellurim, phosphorus and halogen is formed into plasma in the surface of the anode for surface treatment.

However, the elements formed through the surface treatments disclosed in these literatures disadvantageously require a higher drive voltage and involve a greater increase in voltage during driving than those formed through surface treatment using oxygen. In particular, when a reducing gas such as hydrogen gas and deuterium gas is used, the work function of the electrode becomes small. As a result, the hole-injection barrier with respect to an organic film becomes large, resulting in that the formed element requires a high drive voltage.

In one known method of reducing the drive voltage of an element, the organic film thereof is p-doped. When the electrode of the element having a p-doped organic film is oxygen plasma treated, the formed element is decreased in durability as described above. Without surface treatment, a short circuit occurs between the electrodes, and ununiform light emission occurs.

Thus, at present, there cannot still be obtained a satisfactorily high-performance organic electroluminescence element whose drive voltage is low, whose service life is long, and whose durability is good.

BRIEF SUMMARY OF THE INVENTION

The present invention solves the above existing problems and aims to achieve the following objects. Specifically, the present invention aims to provide a method for producing an organic electroluminescence element which method can provide an element whose drive voltage is low, the increase of which in voltage during driving is suppressed, and the decrease of which in durability due to oxidizing gas is suppressed; and an organic electroluminescence element produced by the method.

The present inventor conducted extensive studies to solve the above existing problems, and have found that (1) when a non-oxidizing gas such as argon gas, nitrogen gas, hydrogen gas and deuterium gas is used, the work function of an element treated therewith becomes small as compared with the case where oxygen gas is used and the element requires a higher drive voltage, but the durability thereof is improved, and (2) the increase in drive voltage can be suppressed through p-doping of the hole-injection layer.

The present invention is accomplished on the basis of the above findings obtained by the present inventor. Means for solving the above existing problems are as follows.

<1> A method for producing an organic electroluminescence element, the method including:

subjecting an anode to a surface treatment using at least one non-oxidizing gas, and forming a p-doped hole-injection layer on a surface of the anode subjected to the surface treatment.

<2> The method according to <1> above, wherein the surface treatment is a plasma treatment using a non-oxidizing gas selected from argon gas, nitrogen gas, hydrogen gas and deuterium gas.

<3> The method according to <2> above, wherein the surface treatment is a plasma treatment using deuterium gas.

<4> The method according to any one of <1> to <3> above, wherein the forming the p-doped hole-injection layer is forming a p-doped hole-injection layer on the surface of the anode without being exposed to air.

<5> The method according to any one of <1> to <4> above, wherein the oxygen content of an anode surface of the anode subjected to the surface treatment is lower than that of an anode inside thereof by 3 atomic % or more.

<6> The method according to any one of <1> to <5> above, wherein, in the forming the p-doped hole-injection layer, a hole-injection layer is doped with an electron-accepting dopant in an amount of 0.01% by mass to 50% by mass with respect to the material of the hole-injection layer.

<7> An organic electroluminescence element obtained by the method according to any one of <1> to <6> above.

<8> The organic electroluminescence element according to <7> above, wherein the organic electroluminescence element includes a light-emitting layer which includes a fluorescent light-emitting material as a light-emitting material thereof, and wherein the time required that a luminance of the organic electroluminescence element reaches half of an initial luminance thereof is 2,000 hours or longer when the organic electroluminescence element is continuously driven with a current density being set to 50 mA/cm$^2$.

<9> The organic electroluminescence element according to <7> above, wherein the organic electroluminescence element includes a light-emitting layer which includes a phosphorescent light-emitting material as a light-emitting material thereof, and wherein the time required that a luminance of the organic electroluminescence element reaches half of an initial luminance thereof is 900 hours or longer when the organic electroluminescence element is continuously driven with a current density being set to 5 mA/cm$^2$.

The present invention can provide a method for producing an organic electroluminescence element which method can provide an element whose drive voltage is low, the increase of which in voltage during driving is suppressed, and the decrease of which in durability due to oxidizing gas is suppressed; and an organic electroluminescence element produced by the method. These can solve the existing problems.

DETAILED DESCRIPTION OF THE INVENTION

Method for Producing Organic Electroluminescence Element

A method of the present invention for producing an organic electroluminescence element includes a surface treatment step and a hole-injection layer-forming step; and, if necessary, includes other steps.

The organic electroluminescence element (hereinafter may be referred to as an "organic EL element") contains a pair of electrodes (i.e., an anode and a cathode) and an organic layer including a light-emitting layer and a hole-injection layer between the electrodes; and, if necessary, may contain other layers.

The organic layer contains at least a light-emitting layer; and, if necessary, may further contain a hole-transport layer, an electron-transport layer, a hole-blocking layer, an electron-blocking layer, an electron-injection layer, etc.

The organic electroluminescence element has a laminate in which the hole-injection layer is laid on the anode. Preferably, it has the hole-transport layer between the laminate and the light-emitting layer, and has the electron-transport layer between the cathode and the light-emitting layer. Also, the electron-injection layer may be provided between the electron-transport layer and the cathode. Further, a hole-transportable intermediate layer (electron-blocking layer) may be provided between the light-emitting layer and the hole-transport layer, and an electron-transportable intermediate layer (hole-blocking layer) may be provided between the light-emitting layer and the electron-transport layer. Each organic layer may be composed of a plurality of secondary layers.

The organic layer including the light-emitting layer can be formed with a known method; e.g., can be suitably formed with any of a dry film-forming method such as a vapor deposition method and a sputtering method; a wet film-forming method; a transfer method; a printing method; and an ink-jet method.

<Surface Treatment Step>

The surface treatment step is a step of subjecting the anode to surface treatment using a non-oxidizing gas.

—Anode—

The materials constituting the anode include conductive metal oxides such as tin oxides doped with, for example, antimony and fluorine (ATO and FTO); tin oxide, zinc oxide, indium oxide, indium tin oxide (ITO) and indium zinc oxide (IZO); metals such as gold, silver, chromium and nickel; mixtures or laminates of these metals and the conductive metal oxides; inorganic conductive materials such as copper iodide and copper sulfide; organic conductive materials such as polyaniline, polythiophene and polypyrrole; and laminates of these materials and ITO. Among them, conductive metal oxides are preferred. In particular, ITO is preferred from the viewpoints of productivity, high conductivity, transparency, etc.

The method for forming the anode is not particularly limited and the anode may be formed according to a known method. Examples of the method include wet methods such as printing methods and coating methods; physical methods such as vacuum deposition methods, sputtering methods and ion plating methods; and chemical methods such as CVD and plasma CVD methods. According to a method appropriately selected from these methods in consideration of suitability for the material constituting the anode, the anode can be formed on a substrate. For example, when ITO is used as the material for the anode, the anode may be formed with a DC or high-frequency sputtering method, a vacuum deposition method, or an ion plating method. Notably, when a metal, etc. are used as a material for the below-described cathode, the cathode can be formed by, for example, sputtering one type of metal or two or more types of metals simultaneously or sequentially.

Patterning for forming the anode may be performed by a chemical etching method such as photolithography; a physical etching method such as etching by laser; a method of vacuum deposition or sputtering using a mask; a lift-off method; or a printing method.

—Non-Oxidizing Gas—

The anode formed in the above-described manner is subjected to surface treatment using a non-oxidizing gas. In the present specification, the term "non-oxidizing gas" refers to an inert gas and a reducing gas.

The element used as the non-oxidizing gas is not particularly limited and may be appropriately selected depending on the purpose. From the viewpoint of improving the durability of the organic electroluminescence element, rare gas (e.g., argon gas) and nitrogen gas are preferably used as the inert gas, and hydrogen gas, deuterium gas, etc. are preferably used as the reducing gas.

—Surface Treatment—

The surface treatment is not particularly limited and may be appropriately selected depending on the purpose. Examples thereof include known surface treatment methods such as plasma treatments, various sputtering methods (e.g., ion beam sputtering) and radical beam treatments, with plasma treatments being preferred.

The apparatus, conditions, etc. for the plasma treatment are appropriately selected depending on the purpose, so long as the non-oxidizing gas is formed into plasma and the substrate surface is treated. The plasma treatment must be performed under the conditions under which the irregularities on the electrode surface do not become large by the action of the formed plasma gas. The conditions under which the irregularities on the electrode surface become larger than before treatment are not preferred, since the formed organic EL element may be easier to involve a short circuit between the electrodes.

The oxygen content of an anode surface having undergone such surface treatment is preferably lower than that of an anode inside by 3 atomic % or more.

When the anode is not treated by a surface treatment method of making the oxygen content of the anode surface lower than that of anode inside by 3 atomic % or more, the drive durability of the formed element is not improved in some cases.

In the present specification, the term "anode surface" refers to an area which ranges from a surface of the anode, which surface faces the hole-injection layer, to a depth of 5 nm; and the term "anode inside" refers to an area which ranges from +5 nm of the midpoint of the thickness of the anode to −5 nm thereof. Whether or not the oxygen content of the anode surface is lower than that of the anode inside by 3 atomic % or more can be determined by detecting the oxygen concentrations through SIMS and comparing the oxygen content of the anode surface with that of the anode inside.

<Hole-Injection Layer-Forming Step>

The hole-injection layer-forming step is a step of forming a p-doped hole-injection layer on the surface of the anode which had been subjected to surface treatment at the surface treatment step. In this step, a laminate of the anode and the hole-injection layer is formed.

The hole-injection layer-forming step is not particularly limited and may be appropriately selected depending on the purpose. When this step is performed with being exposed to air, oxygen may adsorb on the resultant laminate. Thus, after surface treatment using a non-oxidizing gas, a p-doped hole-injection layer is preferably formed without being exposed to air.

—Hole-Injection Layer—

The hole-injection layer is a layer having the function of receiving holes from the anode or from the anode side and transporting the holes to the cathode side.

The hole-injection layer has a single-layered structure, or a multi-layered structure made of a plurality of layers which are identical or different in composition.

The hole-injection material therefor may be a low-molecular-weight compound or a high-molecular-weight compound.

Examples thereof include pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, phthalocyanine compounds, porphyrin compounds, thiophene derivatives, organosilane derivatives and carbon. These may be used individually or in combination.

The hole-injection layer can be formed with a known method; e.g., can be suitably formed with any of a dry film-forming method such as a vapor deposition method and a sputtering method; a wet film-forming method; a transfer method; a printing method; and an ink-jet method.

The following compounds are given as specific examples of the hole-injection material employable in the present invention, but should not be construed as limiting the present invention thereto.

HI-1

HI-2

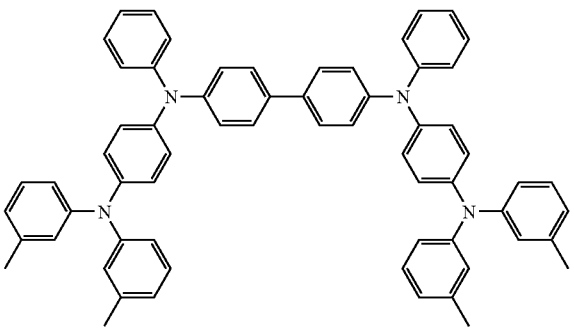

HI-3

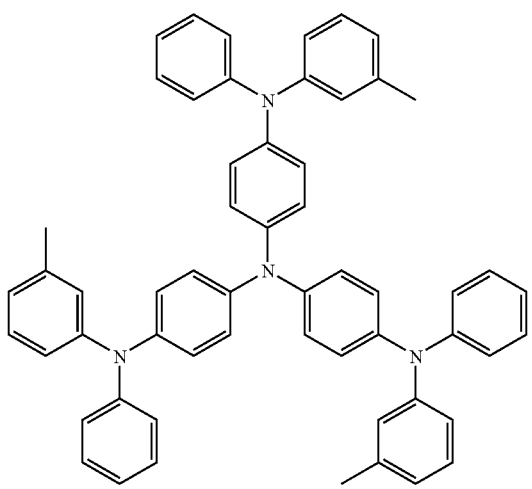

HI-4

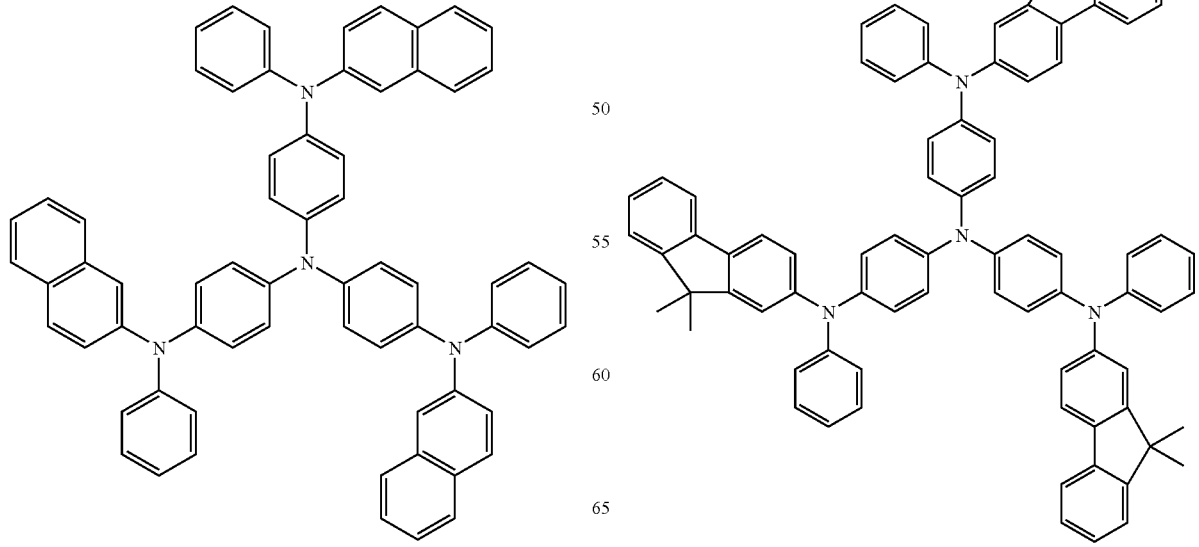

HI-5

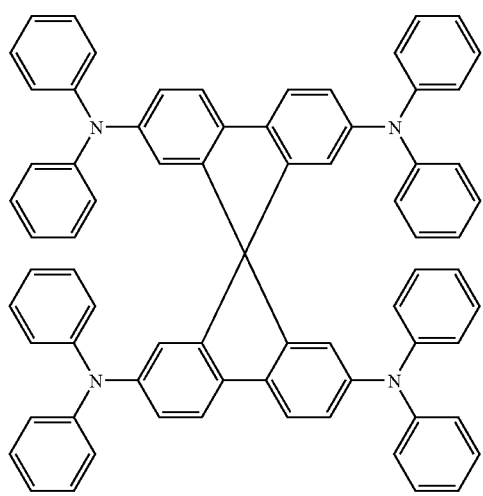

HI-6

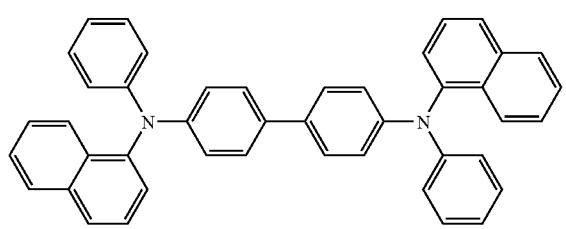

HI-7

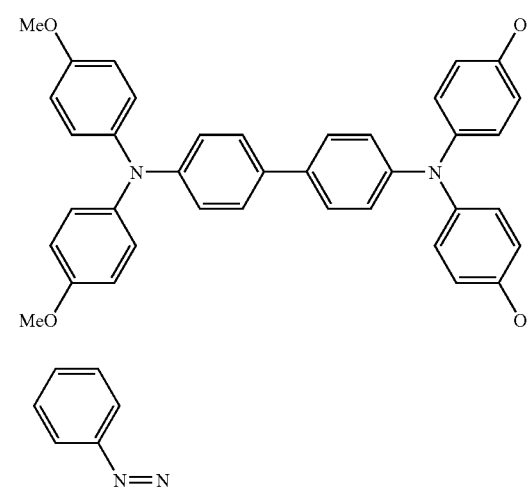

HI-8

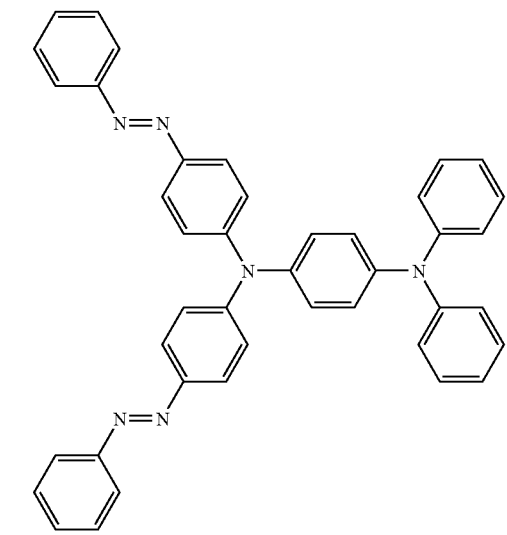

HI-9

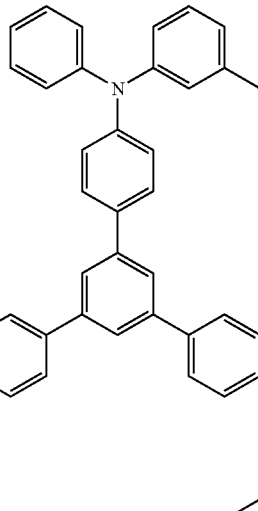

HI-10

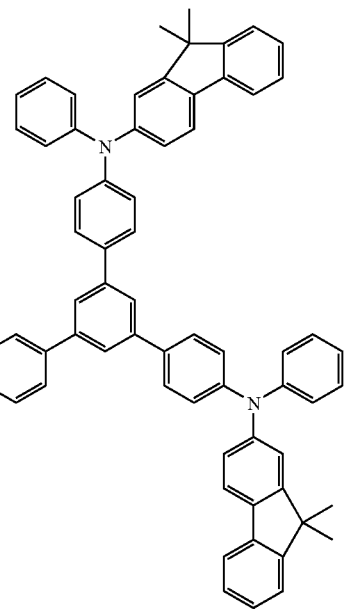

—p-Doping—

The hole-injection layer is p-doped, and specifically, contains an electron-accepting dopant.

The p-doped hole-injection layer can be formed through co-deposition of the hole-injection material and the electron-accepting dopant.

The electron-accepting dopant may be, for example, an inorganic or organic compound, so long as it has electron accepting property and the function of oxidizing an organic compound.

Examples of the inorganic compound include metal halides (e.g., ferric chloride, aluminum chloride, gallium chloride, indium chloride and antimony pentachloride) and metal oxides (e.g., vanadium pentaoxide and molybdenum trioxide).

Examples of the organic compound include those having a substituent such as a nitro group, a halogen, a cyano group and a trifluoromethyl group; quinone compounds; acid anhydride compounds; and fullerenes.

These electron-accepting dopants may be used individually or in combination.

Although the amount of the electron-accepting dopant used depends on the type of material, the dopant is preferably used in an amount of 0.01% by mass to 50% by mass, more preferably 0.05% by mass to 20% by mass, still more preferably 0.1% by mass to 10% by mass, with respect to the material of the hole-injection layer.

When the amount is 0.01% by mass to 50% by mass, the number of carriers in the hole-injection layer is increased to improve hole-injectability and hole-transportability of the layer. But, when the amount is greater than 50% by mass, the number of carriers is decreased inversely, resulting in that the hole-injectability and hole-transportability of the layer may be decreased, which is not preferred.

<Other Steps>

The other steps are not particularly limited and may be appropriately selected depending on the purpose. Examples thereof include a step of forming on the hole-injection layer the cathode and a functional layer selected depending on the purpose from the hole-transport layer, the hole-transportable intermediate layer (electron-blocking layer), the light-emitting layer, the electron-transportable intermediate layer (hole-blocking layer), the electron-transport layer and the electron-injection layer.

<<Light-Emitting Layer>>

The light-emitting layer is a layer having the function of receiving holes from the anode, the hole-injection layer, or the hole-transport layer, receiving electrons from the cathode, the electron-injection layer, or the electron-transport layer, and providing a field for recombination of the holes with the electrons for light emission, when an electric field is applied.

The light-emitting layer contains a light-emitting material. The light-emitting layer may be composed only of a light-emitting material, or may be a layer formed form a mixture of a host material and a light-emitting material (in the latter case, the light-emitting material may be referred to as a "light-emitting dopant" or "dopant").

Further, a material which does not emit light nor transport any charge may be contained in the light-emitting layer.

The thickness of the light-emitting layer is not particularly limited and may be appropriately determined depending on the purpose. It is preferably 2 nm to 500 nm. From the viewpoint of external light-emitting efficiency, it is more preferably 3 nm to 200 nm, particularly preferably 5 nm to 100 nm.

The light-emitting layer may be a single layer or two or more layers. When it is two or more layers, the layers may emit lights of different colors.

—Light-Emitting Material—

The light-emitting material may be, for example, a phosphorescent light-emitting material, a fluorescent light-emitting material, or a mixture of two or more materials.

From the viewpoint of drive durability, it is preferred that the light-emitting dopant is those satisfying the following relation(s) with respect to the above-described host compound: i.e., 1.2 eV>difference in ionization potential ($\Delta$Ip)>0.2 eV and/or 1.2 eV>difference in electron affinity ($\Delta$Ea)>0.2 eV.

The light-emitting dopant is generally contained in the light-emitting layer in an amount of 0.1% by mass to 50% by mass with respect to the total amount of the compounds forming the light-emitting layer. From the viewpoints of durability and external light-emitting efficiency, it is preferably contained in an amount of 1% by mass to 50% by mass, more preferably 2% by mass to 40% by mass.

—Phosphorescent Light-Emitting Material—

The phosphorescent light-emitting material is not particularly limited and may be appropriately selected depending on the purpose. Examples thereof include complexes containing a transition metal atom or a lanthanoid atom.

The transition metal atom is not particularly limited and may be selected depending on the purpose. Preferred are ruthenium, rhodium, palladium, tungsten, rhenium, osmium, iridium, gold, silver, copper and platinum. More preferred are rhenium, iridium and platinum. Particularly preferred are iridium and platinum.

Examples of ligands in the complexes include those described in, for example, "Comprehensive Coordination Chemistry" authored by G. Wilkinson et al., published by Pergamon Press Company in 1987; "Photochemistry and Photophysics of Coordination Compounds" authored by H. Yersin, published by Springer-Verlag Company in 1987; and "YUHKI KINZOKU KAGAKU—KISO TO OUYOU— (Metalorganic Chemistry—Fundamental and Application—)" authored by Akio Yamamoto, published by Shokabo Publishing Co., Ltd. in 1982.

The above-described complexes may be a complex containing one transition metal atom in the compound, or a so-called polynuclear complex containing two or more transition metal atoms. In the latter case, the complexes may contain different metal atoms at the same time.

Examples of the fluorescent light-emitting material include phosphorescent light-emitting compounds described in, for example, U.S. Pat. Nos. 6,303,238 and 6,097,147, WO00/57676 pamplet, WO00/70655 pamplet, WO01/08230 pamplet, WO01/39234 pamplet, WO01/41512 pamplet, WO02/02714 pamplet, WO02/15645 pamplet, WO02/44189 pamplet, WO05/19373 pamplet, WO2004/108857 pamplet, WO2005/042444 pamplet, WO2005/042550 pamplet, JP-A Nos. 2001-247859, 2002-302671, 2002-117978, 2003-133074, 2002-235076, 2003-123982 and 2002-170684, EP No. 1211257, and JP-A Nos. 2002-226495, 2002-234894, 2001-247859, 2001-298470, 2002-173674, 2002-203678, 2002-203679, 2004-357791, 2006-93542, 2006-261623, 2006-256999, 2007-19462, 2007-84635 and 2007-96259.

Among them, Ir complexes, Pt complexes, Cu complexes, Re complexes, W complexes, Rh complexes, Ru complexes, Pd complexes, Os complexes, Eu complexes, Tb complexes, Gd complexes, Dy complexes and Ce complexes are preferred, with Ir complexes, Pt complexes and Re complexes being more preferred. Among them, Ir complexes, Pt complexes, and Re complexes each containing at least one coordination mode of metal-carbon bonds, metal-nitrogen bonds, metal-oxygen bonds and metal-sulfur bonds are still more preferred. Furthermore, Ir complexes, Pt complexes, and Re complexes each containing a tri-dentate or higher poly-dentate ligand are particularly preferred from the viewpoints of, for example, light-emission efficiency, drive durability and chromaticity.

The following compounds are given as non-limitative examples of the phosphorescent light-emitting material employable in the present invention.

D-1
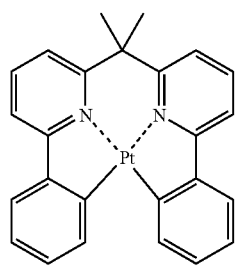
D-2
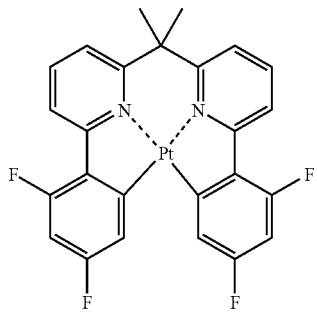
D-3
D-4
D-5
-continued
D-6
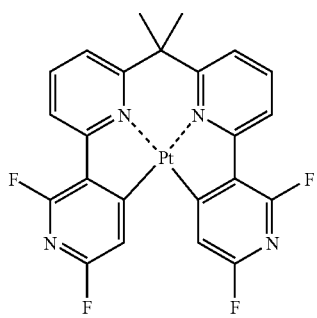
D-7
D-8
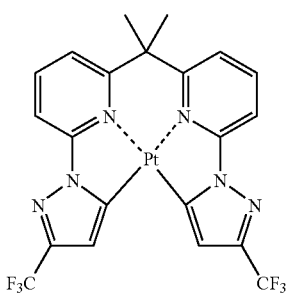
D-9
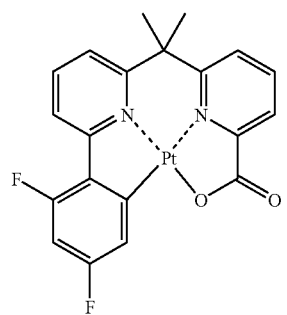
D-10
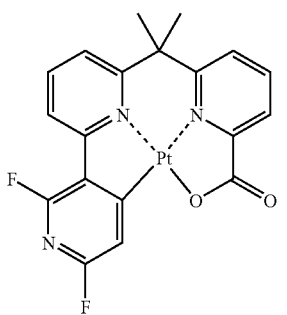

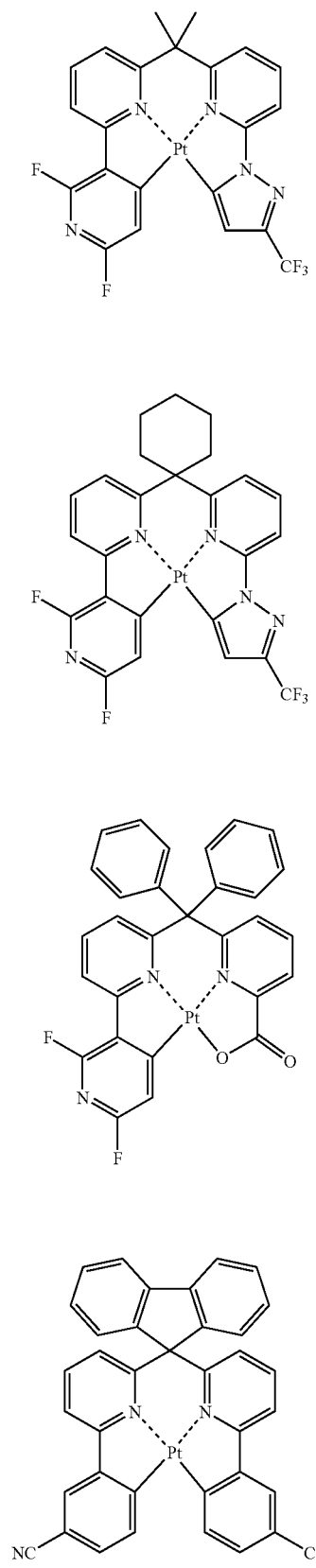
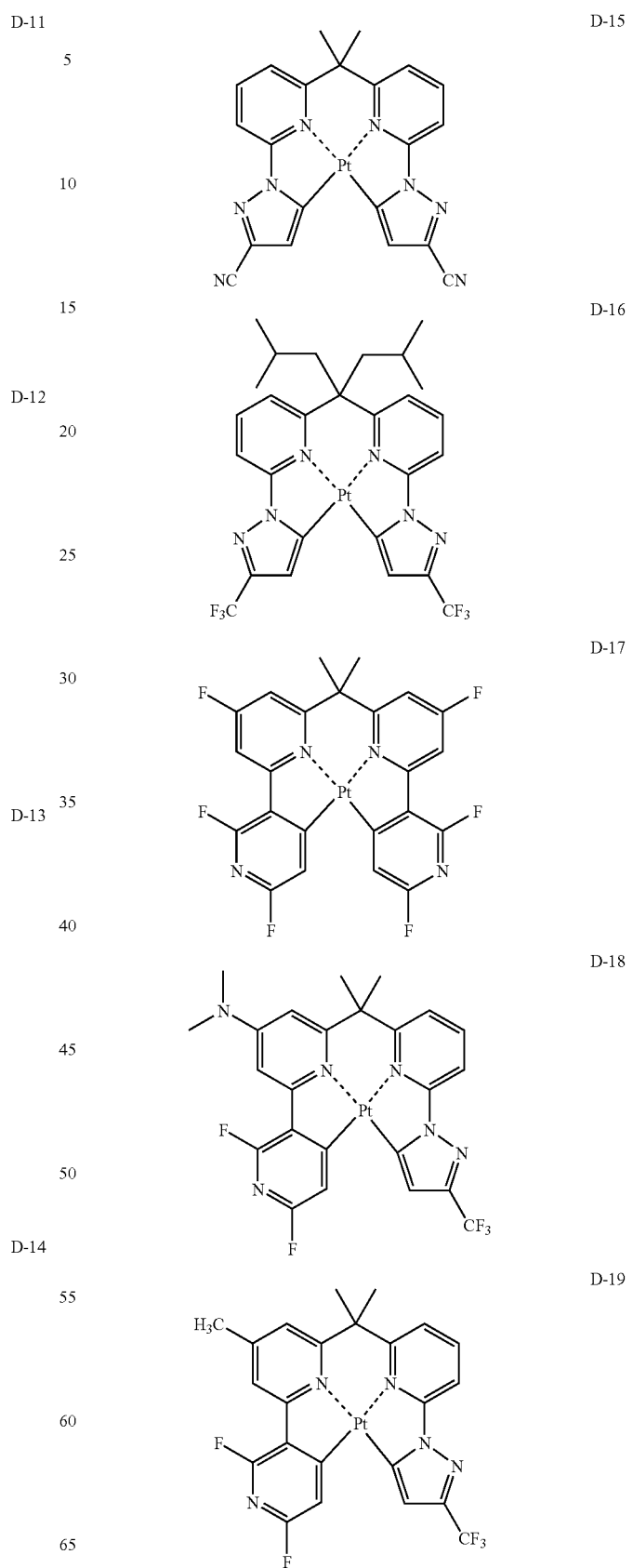

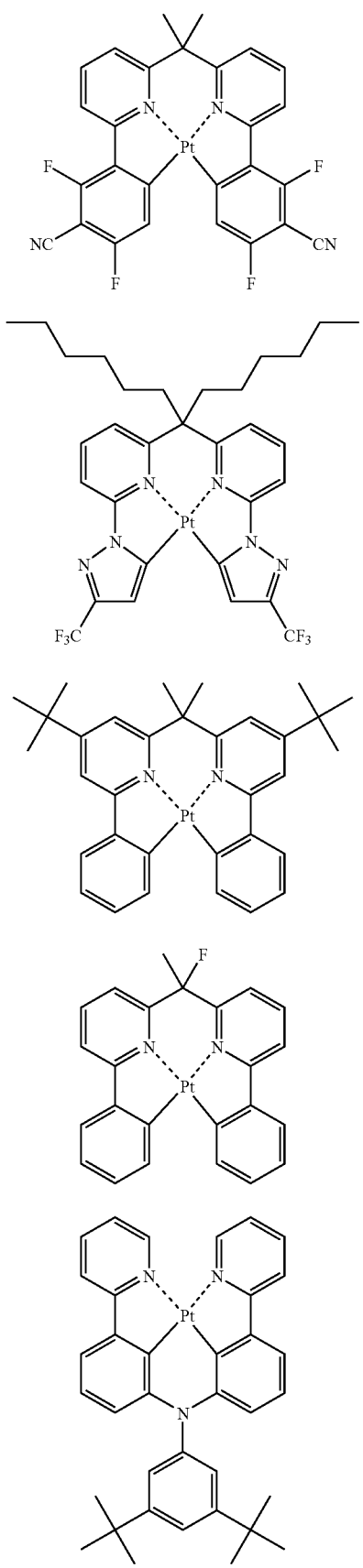
D-20
D-21
D-22
D-23
D-24
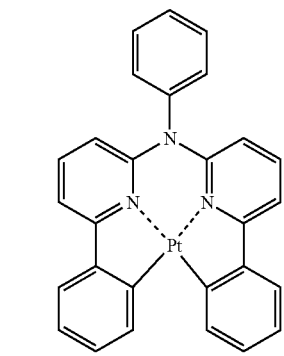
D-25
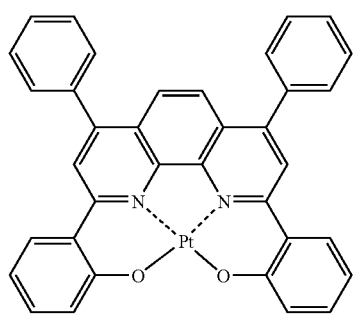
D-26
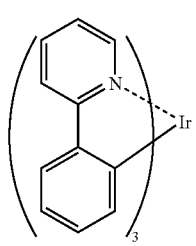
D-27
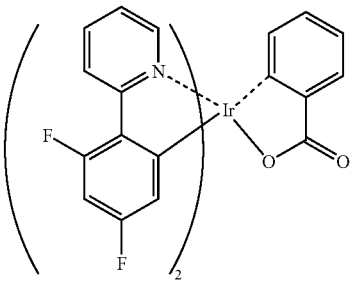
D-28
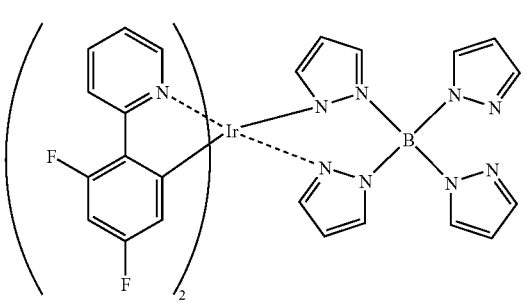
D-29

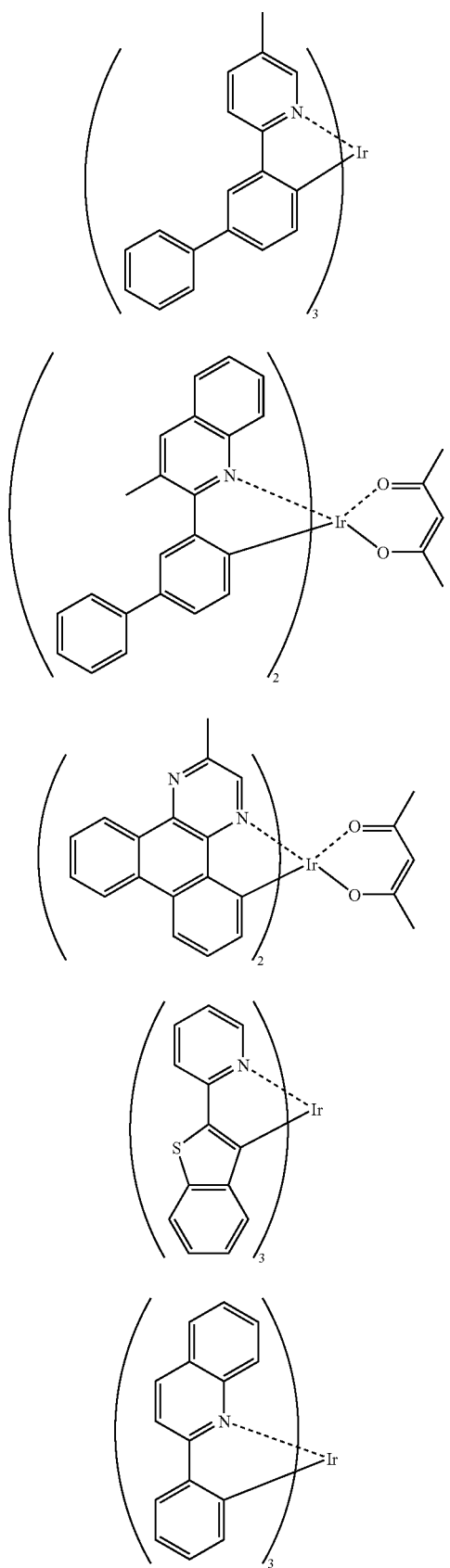
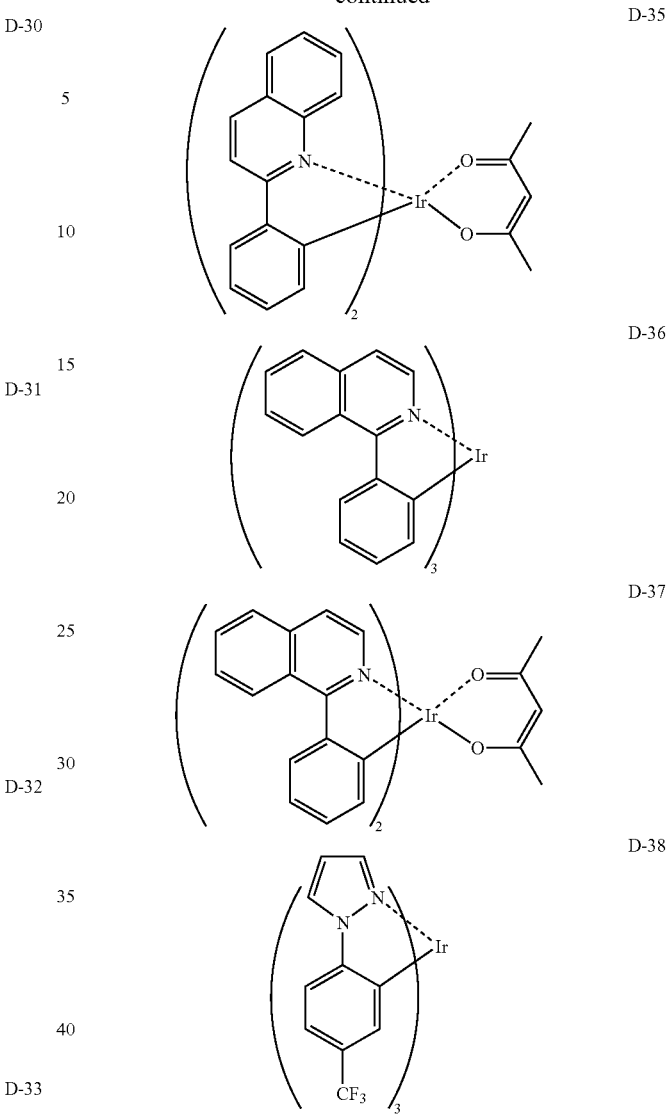

—Fluorescent light-Emitting Material—

The fluorescent light-emitting material is not particularly limited and may be appropriately selected depending on the purpose. Examples thereof include benzoxazole, benzoimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, bis-styrylanthracene, quinacridone, pyrrolopyridine, thiadiazolopyridine, cyclopentadiene, styrylamine, aromatic dimethylidene compounds, condensed polyaromatic compounds (e.g., anthracene, phenanthroline, pyrene, perylene, rubrene and pentacene), various metal complexes (e.g., metal complexes of 8-quinolynol, pyromethene complexes and rare-earth complexes), polymer compounds (e.g., polythiophene, polyphenylene and polyphenylenevinylene), organic silanes and derivatives thereof. These may be used individually or in combination.

—Host Material—

The host material is preferably a charge-transporting material. One type of the host material may be used, or two or more types of the host material may be used.

The charge-transporting material may be hole-transporting host materials excellent in hole transportability or electron-transporting host compounds excellent in electron transportability.

—Hole-Transporting Host Material—

The hole-transporting host material is not particularly limited and may be appropriately selected depending on the purpose. Examples thereof include pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, conductive high-molecular-weight oligomers (e.g., thiophene oligomers and polythiophenes), organic silanes, carbon films and derivatives thereof. These may be used individually or in combination.

Among them, indole derivatives, carbazole derivatives, aromatic tertiary amine compounds and thiophene derivatives are preferred. Also, compounds each containing a carbazole group in the molecule are more preferred. Further, compounds each containing a t-butyl-substituted carbazole group are particularly preferred.

—Electron-Transporting Host Material—

The electron-transporting host material is not particularly limited and may be appropriately selected depending on the purpose. Examples thereof include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyradine, fluorine-substituted aromatic compounds, heterocyclic tetracarboxylic anhydrides (e.g., naphthalene and perylene), phthalocyanine, derivatives thereof (which may form a condensed ring with another ring) and various metal complexes such as metal complexes of 8-quinolynol derivatives, metal phthalocyanine, and metal complexes having benzoxazole or benzothiazole as a ligand. These may be used individually or in combination.

Among them, metal complexes are preferred in terms of durability. As the metal complexes, preferred are those containing a ligand which has at least one nitrogen atom, oxygen atom, or sulfur atom and which is coordinated with the metal.

Examples of the metal complexes include compounds described in, for example, JP-A Nos. 2002-235076, 2004-214179, 2004-221062, 2004-221065, 2004-221068 and 2004-327313.

The following compounds and deuterated products thereof are given as non-limitative examples of the hole-transporting host material and electron-transporting host material employable in the present invention.

H-1

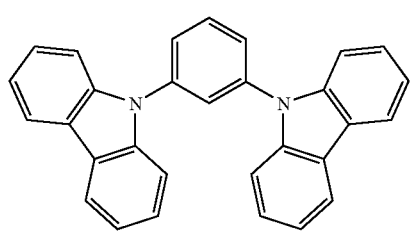

H-2

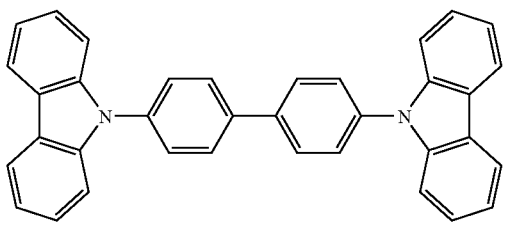

H-3

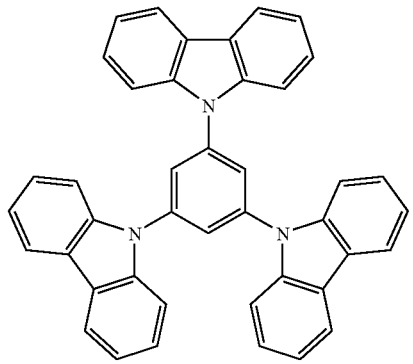

H-4

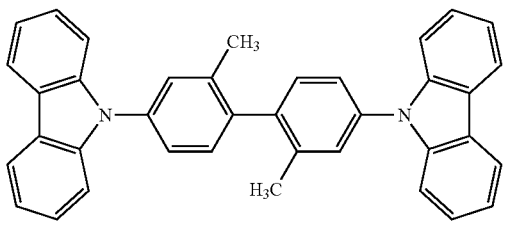

H-5

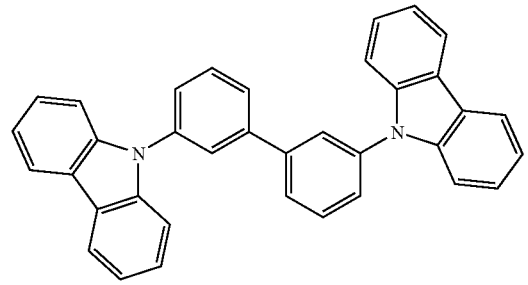

H-6

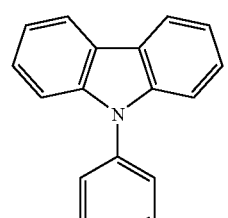

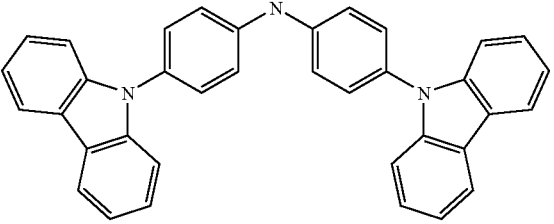

H-7
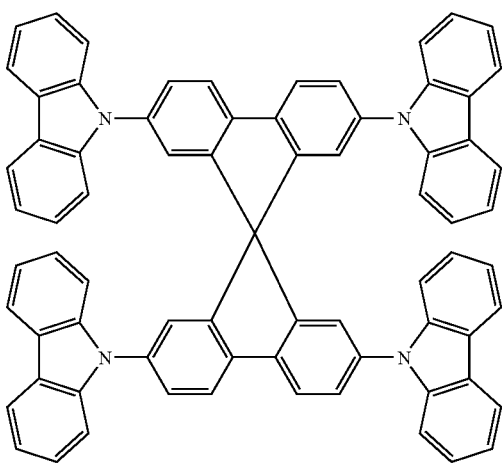
H-8
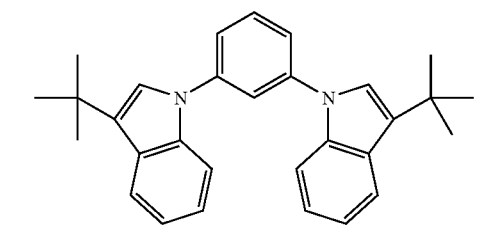
H-9
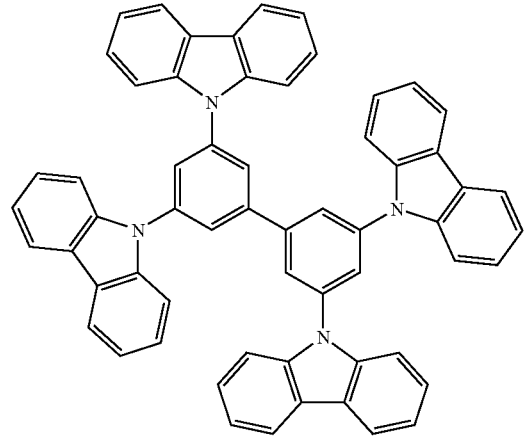
H-10
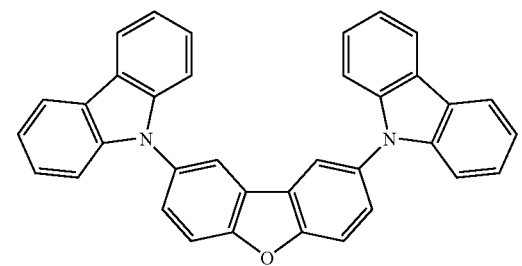
H-11
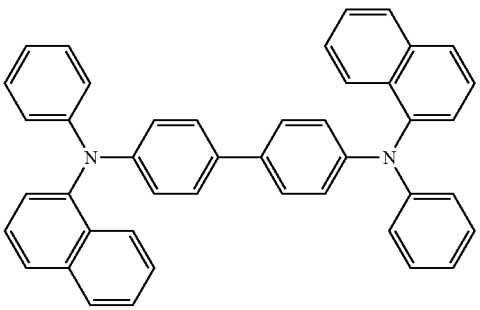
H-12
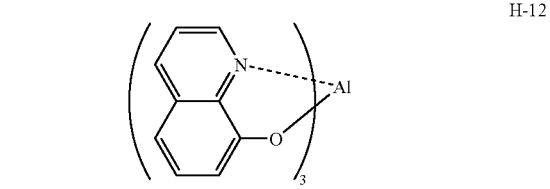
H-13
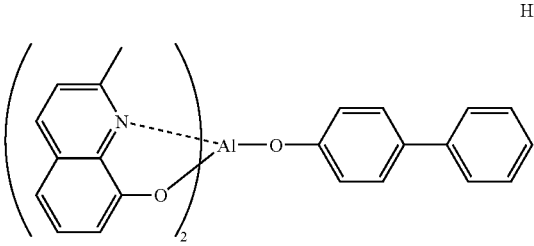
H-14
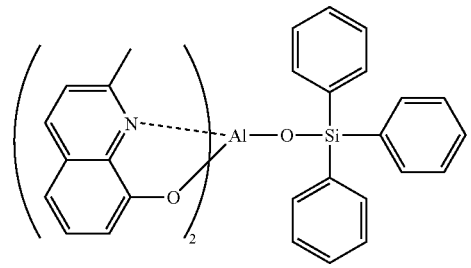
H-15
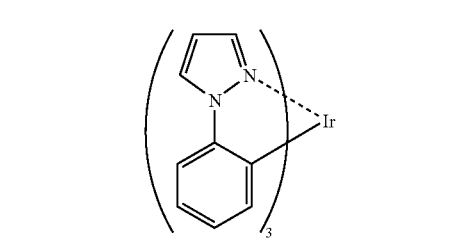
H-16
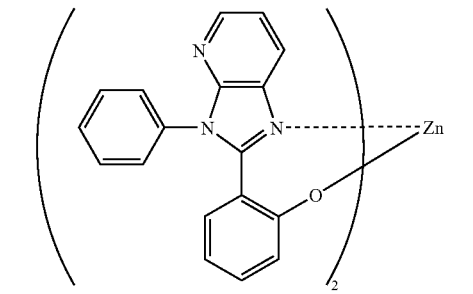

H-17
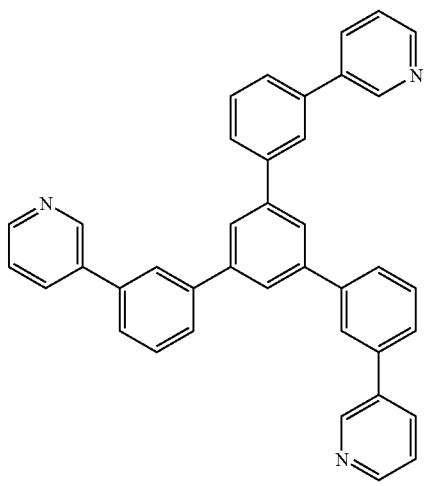

H-18
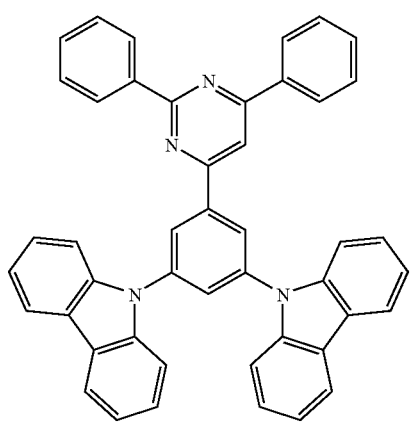

H-19
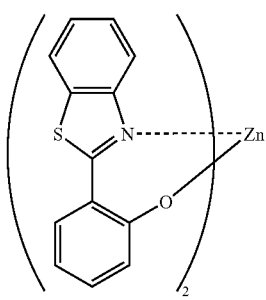

H-20
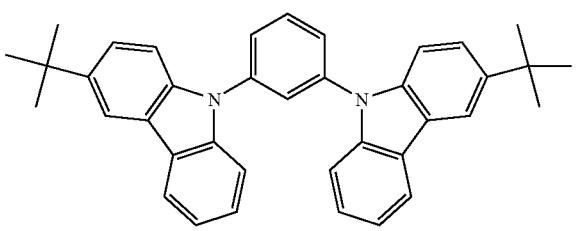

H-21

H-22
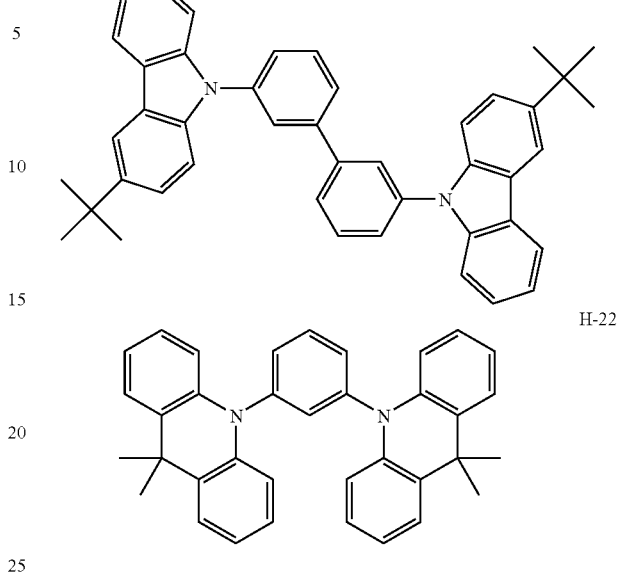

<<Hole-Transport Layer>>

The hole-transport layer, together with the hole-injection layer, is a layer having the function of receiving holes from the anode or from the anode side and transporting the holes to the cathode side.

The hole-transport layer and the hole-injection layer each have a single-layered structure, or a multi-layered structure made of a plurality of layers which are identical or different in composition.

The material for the hole-transport layer and the electron-accepting dopant contained in the hole-transport layer are similar to those described in relation to the hole-injection layer.

<<<Electron-Injection Layer and Electron-Transport Layer>>>

The electron-injection layer and the electron-transport layer are layers having the functions of receiving electrons from the cathode or the cathode side and transporting the electrons to the anode side. The electron-injection materials or electron-transport materials for these layers may be low-molecular-weight or high-molecular-weight compounds.

Specific examples thereof include pyridine derivatives, quinoline derivatives, pyrimidine derivatives, pyrazine derivatives, phthalazine derivatives, phenanthoroline derivatives, triazine derivatives, triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyradine derivatives, aromatic tetracarboxylic anhydrides such as naphthalene and perylene, phthalocyanine derivatives, metal complexes (e.g., metal complexes of 8-quinolinol derivatives), metal phthalocyanine, metal complexes containing benzoxazole or benzothiazole as a ligand, and organic silane derivatives (e.g., silole).

The electron-injection layer or the electron-transport layer may contain an electron donating dopant.

The electron donating dopant to be introduced in the electron-injection layer or the electron-transport layer may be any material, so long as it has an electron-donating property and a property to reduce an organic compound. Preferred examples thereof include alkali metals (e.g., Li), alkaline earth metals (e.g., Mg), transition metals including rare-earth metals, and reducing organic compounds. Among the metals, those having a work function of 4.2 eV or less are particularly preferably used. Specific examples thereof include Li, Na, K, Be, Mg, Ca, Sr, Ba, Y, Cs, La, Sm, Gd and Yb. Also, examples of the reducing organic compounds include nitrogen-containing compounds, sulfur-containing compounds and phosphorus-containing compounds.

These electron donating dopants may be individually or in combination.

The amount of the electron donating dopant used depends on the type of the material, but it is preferably 0.1% by mass to 99% by mass, more preferably 1.0% by mass to 80% by mass, particularly preferably 2.0% by mass to 70% by mass, with respect to the amount of the material of the electron-transport layer.

The electron-injection layer and the electron-transport layer each have a single-layered structure made of one or more of the above-described materials, or a multi-layered structure made of a plurality of layers which are identical or different in composition.

<<Hole Blocking Layer or Electron Blocking Layer>>

The hole blocking layer is a layer having the function of preventing the holes, which have been transported from the anode side to the light-emitting layer, from passing toward the cathode side, and is generally provided as an organic compound layer adjacent to the light-emitting layer on the cathode side.

The electron blocking layer is a layer having the function of preventing the electrons, which have been transported from the cathode side to the light-emitting layer, from passing toward the anode side, and is generally provided as an organic compound layer adjacent to the light-emitting layer on the anode side.

Examples of the compound forming the hole blocking layer include aluminum complexes (e.g., BAlq), triazole derivatives and phenanthroline derivatives (e.g., BCP).

The compound forming the electron blocking layer may be, for example, the above-described hole-transport materials.

The thickness of the hole blocking layer or the electron blocking layer is preferably 1 nm to 500 nm, more preferably 5 nm to 200 nm, particularly preferably 10 nm to 100 nm. The hole blocking layer or the electron blocking layer may have a single-layered structure made of one or more of the above-mentioned materials, or a multi-layered structure made of a plurality of layers which are identical or different in composition.

<<Electrode>>

The organic electroluminescence element contains a pair of electrodes; i.e., an anode and a cathode. In consideration of the characteristics of the organic electroluminescence element, at least one of the anode and the cathode is preferably transparent. In general, the anode may serve as an electrode which supplies holes to an organic compound layer, and the cathode may serve as an electrode which injects electrons into an organic compound layer.

The shape, structure, size, etc. of the electrode are not particularly limited and may be appropriately selected from known electrode materials depending on the application/purpose of the organic electroluminescence element.

Preferred examples of the material for the electrode include metals, alloys, metal oxides, conductive compounds and mixtures thereof.

—Anode—

The anode is formed similar to formation of the anode in the present invention

—Cathode—

Examples of the materials for the cathode include alkali metals (e.g., Li, Na, K and Cs), alkaline earth metals (e.g., Mg and Ca), gold, silver, lead, aluminum, sodium-potassium alloys, lithium-aluminum alloys, magnesium-silver alloys and rare earth metals (e.g., indium and ytterbium). These may be used individually, but it is preferred that two or more of them are used in combination from the viewpoint of satisfying both stability and electron-injectability.

Among them, alkali metals or alkaline earth metals are preferred in terms of excellent electron-injectability, and materials containing aluminum as a major component are preferred in terms of excellent storage stability.

The term "material containing aluminum as a major component" refers to a material composed of aluminum alone; alloys containing aluminum and 0.01% by mass to 10% by mass of an alkali or alkaline earth metal; or the mixtures thereof (e.g., lithium-aluminum alloys and magnesium-aluminum alloys).

Patterning performed in the method for forming the cathode and when the cathode is formed may be performed similar to the case where the anode is formed.

<<Substrate>>

The organic electroluminescence element is preferably provided on a substrate. The organic electroluminescence element may be provided so that the electrode thereof is in direct contact with the substrate, or so that the electrode is in contact with the substrate via an intermediate layer.

The material for the substrate is not particularly limited and may be appropriately selected depending on the purpose. Examples thereof include inorganic materials such as yttria-stabilized zirconia (YSZ) and glass (alkali-free glass and soda-lime glass); and organic materials such as polyesters (e.g., polyethylene terephthalate, polybutylene phthalate and polyethylene naphthalate), polystyrene, polycarbonate, polyether sulfone, polyarylate, polyimide, polycycloolefin, norbornene resins and poly(chlorotrifluoroethylene).

The shape, structure, size, etc. of the substrate are not particularly limited and may be appropriately selected depending on, for example, the application/purpose of the formed light-emitting element. In general, the shape thereof is preferably a sheet shape. The substrate may have a single- or multi-layered structure, and may be a single member or a combination of two or more members. The substrate may be opaque, colorless transparent, or colored transparent.

The substrate may be provided with a moisture permeation-preventing layer (gas barrier layer) on the front or back surface thereof.

The moisture permeation-preventing layer (gas barrier layer) is preferably made from an inorganic compound such as silicon nitride and silicon oxide.

The moisture permeation-preventing layer (gas barrier layer) can be formed through, for example, high-frequency sputtering.

<<Protective Layer>>

The organic electroluminescence element may be entirely protected with a protective layer.

The material contained in the protective layer is not particularly limited, so long as it has the function of preventing permeation of water, oxygen, etc., which promote degradation of the element, and may be appropriately selected depending on the purpose. Examples thereof include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal nitrides such as $SiN_x$ and SiN$_x$O$_y$; metal fluorides such as MgF$_2$, LiF, AlF$_3$ and CaF$_2$; polyethylenes, polypropylenes, polymethyl methacrylates, polyimides, polyureas, polytetrafluoroethylenes, polychlorotrifluoroethylenes, polydichlorodifluoroethylenes, copolymers of chlorotrifluoroethylens and dichlorodifluoroethylenes, copolymers produced through compolymerization of a monomer mixture containing tetrafluoroethylene and at least one comonomer, fluorine-containing copolymers containing a ring structure in the copolymerization main chain, water-absorbing materials each having a water absorption rate of 1% or more, and moisture permeation preventive substances each having a water absorption rate of 0.1% or less.

The method for forming the protective layer is not particularly limited and may be appropriately selected depending on the purpose. Examples thereof include a vacuum deposition method, a sputtering method, a reactive sputtering method, a molecular beam epitaxial (MBE) method, a cluster ion beam method, an ion plating method, a plasma polymerization method (high-frequency excitation ion plating method), a plasma CVD method, a laser CVD method, a thermal CVD method, a gas source CVD method, a coating method, a printing method and a transfer method.

—Seal Container—

The organic electroluminescence element may be entirely sealed with a seal container. Further, a moisture absorbent or an inert liquid may be contained in the space between the seal container and the organic electroluminescence element.

The moisture absorbent is not particularly limited and may be appropriately selected depending on the purpose. Examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite and magnesium oxide.

The inert liquid is not particularly limited and may be appropriately selected depending on the purpose. Examples thereof include paraffins; liquid paraffins; fluorine-containing solvents such as perfluoroalkanes, perfluoroamines and perfluoroethers; chlorinated solvents; and silicone oils.

—Resin Seal Layer—

The organic electroluminescence element is preferably sealed with a resin seal layer so as to prevent degradation thereof due to oxygen and/or moisture contained in the air.

The resin material for the resin seal layer is not particularly limited and may be appropriately selected depending on the purpose. Examples thereof include acrylic resins, epoxy resins, fluorine-containing resins, silicone resins, rubber resins and ester resins. Among them, epoxy resins are preferred from the viewpoint of preventing water permeation. Among the epoxy resins, thermosetting epoxy resins and photo-curable epoxy resins are preferred.

The forming method for the resin seal layer is not particularly limited and may be appropriately selected depending on the purpose. Examples thereof include a method by coating a resin solution, a method by press-bonding or hot press-bonding a resin sheet, and a method by polymerizing under dry conditions (e.g., vapor deposition and sputtering).

—Sealing Adhesive—

The organic electroluminescence element contains a sealing adhesive having the function of preventing permeation of moisture or oxygen from the edges thereof.

The material for the sealing adhesive may be those used in the resin seal layer. Among them, epoxy resins are preferred from the viewpoint of preventing water permeation, with photo-curable epoxy resins and thermosetting epoxy resins being preferred.

Also, a filler is preferably added to the sealing adhesive. The filler is preferably inorganic materials such as SiO$_2$, SiO (silicon oxide), SiON (silicon oxynitride) and SiN (silicon nitride). The filler increases the viscosity of the sealing adhesive to improve processability and humidity resistance.

The sealing adhesive may also contain a desiccant. Examples of the desiccant include barium oxide, calcium oxide or strontium oxide. The amount of the desiccant added to the sealing adhesive is preferably 0.01% by mass to 20% by mass, more preferably 0.05% by mass to 15% by mass. When the amount is less than 0.01% by mass, the desiccant exhibits reduced effects. Whereas when the amount is more than 20% by mass, it may be difficult to homogeneously disperse the desiccant in the sealing adhesive.

In the present invention, the sealing adhesive containing the desiccant is applied in a predetermined amount using, for example, a dispenser. Thereafter, a second substrate is overlaid, followed by curing for sealing.

—Driving—

The organic electroluminescence element can emit light when a DC voltage (which, if necessary, may contain AC components) (generally 2 volts to 15 volts) or a DC is applied to between the anode and the cathode.

The organic electroluminescence element can be applied to an active matrix by a thin film transistor (TFT). An active layer of the thin film transistor can be formed from, for example, amorphous silicone, high-temperature polysilicone, low-temperature polysilicone, microcrystalline silicone, oxide semiconductor, organic semiconductor or carbon nanotube.

Examples of the thin film transistor employable in the organic electroluminescence element include those described in, for example, WO2005/088726 pamphlet, JP-A No. 2006-165529, U.S. Pat. Application Publication 2008/0237598 A1.

The organic electroluminescence element is not particularly limited, and the light-extraction efficiency can be improved by various known methods. It is possible to increase the light-extraction efficiency to improve the external quantum efficiency, for example, by processing the surface shape of the substrate (for example, by forming a fine concavo-convex pattern), by controlling the refractive index of the substrate, the ITO layer and/or the organic layer, or by controlling the thickness of the substrate, the ITO layer and/or the organic layer.

The organic electroluminescence element may be used in a top-emission configuration or a bottom-emission configuration, in order for light to be extracted.

The organic electroluminescence element may have a resonator structure. For example, on a transparent substrate are stacked a multi-layered film mirror composed of a plurality of laminated films having different reflective indices, a transparent or semi-transparent electrode, a light-emitting layer and a metal electrode. The light generated in the light-emitting layer is repeatedly reflected between the multi-layered film mirror and the metal electrode (which serve as reflection plates); i.e., is resonated.

In another preferred embodiment, a transparent or semi-transparent electrode and a metal electrode are stacked on a transparent substrate. In this structure, the light generated in the light-emitting layer is repeatedly reflected between the transparent or semi-transparent electrode and the metal electrode (which serve as reflection plates); i.e., is resonated.

For forming the resonance structure, an optical path length determined based on the effective refractive index of two reflection plates, and on the refractive index and the thickness of each of the layers between the reflection plates is adjusted to be an optimal value for obtaining a desired resonance wavelength. The calculation formula applied in the case of the first embodiment is described in JP-A No. 09-180883. The calculation formula in the case of the second embodiment is described in JP-A No. 2004-127795.

—Applications—

The application of the organic electroluminescence element is not particularly limited and may be appropriately selected depending on the purpose. It can be suitably used in, for example, display elements, displays, backlights, electrophotography, illuminating light sources, recording light sources, exposing light sources, reading light sources, markers, signs, interior accessories and optical communication.

As a method for forming a full color-type organic EL display, there are known, for example, as described in "Monthly Display," September 2000, pp. 33 to 37, a tricolor light emission method by arranging, on a substrate, organic EL elements emitting lights corresponding to three primary colors (blue color (B), green color (G) and red color (R)); a white color method by separating white light emitted from an organic electroluminescence element for white color emission into three primary colors through a color filter; and a color conversion method by converting a blue light emitted from an organic electroluminescence element for blue light emission into red color (R) and green color (G) through a fluorescent dye layer. Further, by combining a plurality of organic electroluminescence elements emitting lights of different colors which are obtained by the above-described methods, plane-type light sources emitting lights of desired colors can be obtained. For example, there are exemplified white light-emitting sources obtained by combining blue and yellow light-emitting elements, and white light-emitting sources obtained by combining blue, green and red light-emitting elements.

(Organic Electroluminescence Element)

The organic electroluminescence element of the present invention is obtained by the method of the present invention for producing an organic electroluminescence element.

The organic electroluminescence element has a pair of electrodes (i.e., an anode and a cathode) and an organic layer containing a light-emitting layer and a hole-injection layer between the electrodes; and, if necessary, further contains a hole-transport layer, an electron-transport layer, a hole-blocking layer, an electron-blocking layer, an electron-injection layer, etc.

The organic electroluminescence element has a laminate in which the hole-injection layer is formed on the anode. Preferably, the hole-transport layer is provided between the laminated structure and the light-emitting layer, and the electron-transport layer is provided between the cathode and the light-emitting layer. Also, the electron-injection layer may be provided between the electron-transport layer and the cathode. Further, a hole-transportable intermediate layer (electron-blocking layer) may be provided between the light-emitting layer and the hole-transport layer, and an electron-transportable intermediate layer (hole-blocking layer) may be provided between the light-emitting layer and the electron-transport layer. Each organic layer may be composed of a plurality of secondary layers.

The electrodes and the functional layers (e.g., the light-emitting layer and the hole-injection layer) may be those described in relation to the method of the present invention for producing an organic electroluminescence element.

EXAMPLES

The present invention will next be described by way of examples, which should not be construed as limiting the present invention thereto.

Comparative Examples 1 to 8 and Examples 1 to 4

Green Fluorescent Light-Emitting Elements

Comparative Example 1

Production of Organic Electroluminescence Element

A glass substrate (thickness: 0.7 mm, 2.5 cm×2.5 cm) was placed in a washing container. The substrate was washed in 2-propanol through ultrasonication, and then was UV-ozone treated for 30 min. The following layers were formed on this glass substrate through vacuum vapor deposition. Notably, in Examples and Comparative Examples, unless otherwise specified, the deposition rate was 0.2 nm/sec. The deposition rate was measured with a quartz crystal unit. Also, the layer thicknesses given below were measured with a quartz crystal unit.

First, on the glass substrate was formed a 100 nm-thick indium tin oxide (ITO) layer serving as an anode.

The anode was oxygen plasma treated using an EXAM-type plasma cleaning apparatus (product of Shinko Seiki Co., Ltd) under the following conditions: flow rate of oxygen: 70 mL/min, treatment time: 1 min, and RF power: 80 W.

Next, 4,4',4''-tris(N-(2-naphtyl)-N-phenyl-amino)-triphenylamine (2-TNATA) was deposited on the anode (ITO) so as to form a 120 nm-thick hole-injection layer.

Next, bis[N-(1-naphthyl)-N-phenyl]benzidine ($\alpha$-NPD) was deposited on the hole-injection layer so as to form a 30 nm-thick hole-transport layer.

Next, tris(8-hydroxyquinolinato)aluminum(III) (Alq3) was deposited on the hole-transport layer so as to form a 50 nm-thick layer serving as both a green light-emitting layer and an electron-transport layer.

Next, LiF was deposited on the electron-transport layer so as to form a 1 nm-thick electron-injection layer.

Next, a 70 nm-thick cathode was formed on the electron-injection layer by depositing metallic aluminum via a patterned mask placed on the layer (the mask being patterned so that the formed light-emitting area becomes 2 mm×2 mm).

The thus-obtained laminate was placed in a glove box which had been purged with argon gas, and then was sealed in a stainless steel sealing can using a UV-ray curable adhesive (XNR5516HV, product of Nagase-CIBA Ltd.). Through the above procedure, an organic electroluminescence element of Comparative Example 1 was produced.

Comparative Example 2

The procedure of Comparative Example 1 was repeated, except that the hole-injection layer was doped with an electron-accepting dopant (F4TCQN: 2,3,5,6-tetrafluoro-7,7,8,8-tetracyanoquinodimethane) in an amount of 0.3% by mass with respect to the material of the hole-injection layer, to thereby produce an organic electroluminescence element of Comparative Example 2.

The p-doped hole-injection layer was formed through co-deposition of the hole-injection material and the electron-accepting dopant. The concentration of F4-TCNQ was adjusted to 0.3% by mass by setting the deposition rates of 2-TNATA and F4-TCNQ to 0.5 nm/s and 0.0015 nm/s, respectively.

Comparative Example 3

The procedure of Comparative Example 1 was repeated, except that the oxygen plasma treatment of the anode was not performed, to thereby produce an organic electroluminescence element of Comparative Example 3.

Comparative Example 4

The procedure of Comparative Example 2 was repeated, except that the oxygen plasma treatment of the anode was not performed, to thereby produce an organic electroluminescence element of Comparative Example 4.

Comparative Example 5

The procedure of Comparative Example 1 was repeated, except that a plasma treatment using argon gas was performed instead of the oxygen plasma treatment, to thereby produce an organic electroluminescence element of Comparative Example 5.

Comparative Example 6

The procedure of Comparative Example 1 was repeated, except that a plasma treatment using nitrogen gas was performed instead of the oxygen plasma treatment, to thereby produce an organic electroluminescence element of Comparative Example 6.

Comparative Example 7

The procedure of Comparative Example 1 was repeated, except that a plasma treatment using hydrogen gas was performed instead of the oxygen plasma treatment, to thereby produce an organic electroluminescence element of Comparative Example 7.

Comparative Example 8

The procedure of Comparative Example 1 was repeated, except that a plasma treatment using deuterium gas was performed instead of the oxygen plasma treatment, to thereby produce an organic electroluminescence element of Comparative Example 8.

Example 1

The procedure of Comparative Example 5 was repeated, except that the hole-injection layer was doped with an electron-accepting dopant (F4TCQN) in an amount of 0.3% by mass with respect to the material of the hole-injection layer, to thereby produce an organic electroluminescence element of Example 1.

Example 2

The procedure of Comparative Example 6 was repeated, except that the hole-injection layer was doped with an electron-accepting dopant (F4TCQN) in an amount of 0.3% by mass with respect to the material of the hole-injection layer, to thereby produce an organic electroluminescence element of Example 2.

Example 3

The procedure of Comparative Example 7 was repeated, except that the hole-injection layer was doped with an electron-accepting dopant (F4TCQN) in an amount of 0.3% by mass with respect to the material of the hole-injection layer, to thereby produce an organic electroluminescence element of Example 3.

Example 4

The procedure of Comparative Example 8 was repeated, except that the hole-injection layer was doped with an electron-accepting dopant (F4TCQN) in an amount of 0.3% by mass with respect to the material of the hole-injection layer, to thereby produce an organic electroluminescence element of Example 4.

<Measurement Methods>

As described below, each of the organic electroluminescence elements (green fluorescent light-emitting elements) of Comparative Examples 1 to 8 and Examples 1 to 4 was measured for work function of the electrode, EL quantum efficiency, drive voltage, increase in voltage during driving, durability, trace of short circuit, and the oxygen content of the electrode surface. The results are shown in Table 1 given below. The oxygen content of the electrode inside was found to be constant; i.e., 55 atomic % when treated in any treatment methods.

—Measurement of Work Function—

A thin film sample was formed on a glass substrate through vacuum vapor deposition, and was measured for work function using AC-2 (product of RIKEN KEIKI Co., Ltd.). The thickness of the thin film sample was 50 nm.

—Measurement of EL Quantum Efficiency—

Using source measure unit 2400 (product of TOYO TECHNICA Inc.), DC current was applied to each element for light emission. The luminance was measured by luminance meter BM-8 (product of TOPCON CORPORATION). The luminescence spectrum and the luminescence wavelength were measured by spectrum analyzer PMA-11 (product of Hamamatsu Photonics, K.K.). On the basis of the obtained values, the EL quantum efficiency was calculated by a luminescence conversion method when the current density reached 25 mA/cm$^2$ in Comparative Examples 1 to 8 and Examples 1 to 4 and when the current density reached 10 mA/cm$^2$ in Comparative Examples 9 to 16 and Examples 5 to 10 described below.

—Measurement of Drive Voltage—

Using source measure unit 2400 (product of TOYO TECHNICA Inc.), DC current was applied to each element for light emission. The drive voltage was measured for comparison when the current density reached 25 mA/cm$^2$ in Comparative Examples 1 to 8 and Examples 1 to 4, and when the current density reached 10 mA/cm$^2$ in Comparative Examples 9 to 16 and Examples 5 to 10 described below.

—Measurement of Increase in Voltage—

Each element was caused to emit light continuously with the current density being constant. In Comparative Examples 1 to 8 and Examples 1 to 4, the initial voltage was compared with a voltage measured at the time when the drive time reached 1,000 hours, with the difference therebetween being an increase in voltage. In Comparative Examples 9 to 16 and Examples 5 to 10 described below, the initial voltage was compared with a voltage measured at the time when the drive time reached 500 hours, with the difference therebetween being an increase in voltage.

—Measurement of Durability—

A constant current was applied to each element and the element was continuously driven, and the time required that the luminance reached half of the initial luminance was measured. The change in luminance over time was evaluated with the current density being set to 50 mA/cm² in Comparative Examples 1 to 8 and Examples 1 to 4, and with the current density being set to 5 mA/cm² in Comparative Examples 9 to 16 and Examples 5 to 10 described below. The half-life of the luminance of the element was used as an index of durability.

—Measurement of Trace of Short Circuit—

Using source measure unit 2400 (product of TOYO TECHNICA Inc.), a constant current was applied to each element in a current mode. With the maximum voltage being set to 50 V, current application and current termination were repeated several tens times. If a short circuit occurs between the upper and bottom electrodes, current is intensively applied to the sites where the short circuit occurs, and the sites are broken to be insulative. The sites broken remain as traces of short circuit, and the number of the sites can be microscopically counted. Actually, the number of traces of short circuit was counted in a 2 mm×2 mm light-emitting surface for evaluation. The frequency of occurrence of short circuit between the upper and bottom electrodes increased due to foreign matter on the electrodes. Thus, the number of traces of short circuit was used as an index for evaluating cleanliness of the electrode surfaces.

—Measurement of the Oxygen Content of Electrode—

Through secondary ion mass spectrometry (SIMS), the oxygen concentration of the electrode surface was compared with that of the electrode inside. The oxygen concentration was the amount (atomic %) of oxygen atoms contained in the total number of indium, tin and oxygen atoms. The apparatus used was SIMS4000 (product of ATOMIKA Co.). Specifically, each sample was irradiated with Cs⁺ ions, and secondary ions of indium, tin and oxygen were measured. Here, the sample is scraped off by a sputtering phenomenon as the irradiation time passes and thus, the secondary ions observed reflect the composition of the electrode inside. The initial amount of secondary ions was compared with the amount of secondary ions observed when the electrode was scraped off to the vicinity of the midpoint thereof, to thereby calculate the concentrations of oxygen atoms in the surface and inside. The oxygen content of the electrode inside was found to be constant; i.e., 55 atomic % when treated in any treatment methods.

Comparative Examples 9 to 16 and Examples 5 to 10

Blue Phosphorescent Light-Emitting Elements

Comparative Example 9

Production of Organic Electroluminescence Element

A glass substrate (thickness: 0.7 mm, 2.5 cm×2.5 cm) was placed in a washing container. The substrate was washed in 2-propanol through ultrasonication, and then was UV-ozone treated for 30 min. The following layers were formed on this glass substrate through vacuum vapor deposition. Notably, in Examples and Comparative Examples, unless otherwise specified, the deposition rate was 0.2 nm/sec. The deposition rate was measured with a quartz crystal unit. Also, the layer thicknesses given below were measured with a quartz crystal unit.

First, on the glass substrate was formed a 100 nm-thick ITO layer serving as an anode.

The anode was oxygen plasma treated using an EXAM-type plasma cleaning apparatus (product of Shinko Seiki Co., Ltd) under the following conditions: flow rate of oxygen: 70 mL/min, treatment time: 1 min, and RF power: 80 W.

Next, N,N'-diphenyl-N,N'-bis-[4-(phenyl-m-tolylamino)-phenyl]-biphenyl-4,4'-diamine (DNTPD) was deposited on the anode (ITO) so as to form a 120 nm-thick hole-injection layer.

Next, α-NPD was deposited on the hole-injection layer so as to form a 7 nm-thick first hole-transport layer.

Next, 3,6-di(N-carbazolyl)-N-phenyl-carbazole (HT-1) was deposited thereon so as to a 3 nm-thick second hole-transport layer.

Next, 1,3-bis(carbazol-9-yl)benzene (mCP) serving as a host material and [(1-methylethane-1,1-diyl)bis[(6,2-pyridinediyl-κN)[3-(trifluoromethyl)-1H-pyrazole-1,5-diyl-κC]]]platinum (Pt-1) serving as a blue phosphorescent light-emitting material were co-deposited on the hole-transport layer so as to form a 30 nm-thick light-emitting layer. The film forming rate during deposition was set so that the concentration of the light-emitting material was adjusted to 15% by mass.

Next, bis-(2-methyl-8-quinolinolato)-4-(phenyl-phenolate)-aluminium (III) (BAlq) was deposited on the light-emitting layer so as to form a 30 nm-thick electron-transport layer.

Next, LiF was deposited on the electron-transport layer so as to form a 1 nm-thick electron-injection layer.

TABLE 1

| A | Plasma treatment | p-Doping | Work function (eV) | Quantum efficiency (%) | Drive voltage (V) | Increase in voltage (V) | Durability (h) | Trace of short circuit | O content (atomic %) |
|---|---|---|---|---|---|---|---|---|---|
| Comp. Ex. 1 | Oxygen | Not p-doped | 5.1 | 1.1 | 10.0 | 1.5 | 500 | Not observed | 56 |
| Comp. Ex. 2 | Oxygen | p-Doped | 5.1 | 1.0 | 9.4 | 0.7 | 1,000 | Not observed | 56 |
| Comp. Ex. 3 | Not performed | Not p-doped | 4.6 | 1.1 | 12.3 | 5.2 | 800 | Numerous | 55 |
| Comp. Ex. 4 | Not performed | p-Doped | 4.6 | 1.0 | 9.7 | 0.9 | 1,500 | Numerous | 55 |
| Comp. Ex. 5 | Argon | Not p-doped | 4.9 | 1.1 | 12.1 | 3.2 | 1,500 | Not observed | 52 |
| Comp. Ex. 6 | Nitrogen | Not p-doped | 4.9 | 1.1 | 12.3 | 3.1 | 1,500 | Not observed | 52 |
| Comp. Ex. 7 | Hydrogen | Not p-doped | 4.4 | 1.1 | 14.7 | 4.2 | 1,500 | Not observed | 51 |
| Comp. Ex. 8 | Deuterium | Not p-doped | 4.4 | 1.1 | 14.7 | 4.1 | 1,800 | Not observed | 51 |
| Ex. 1 | Argon | p-Doped | 4.9 | 1.0 | 9.5 | 0.7 | 2,000 | Not observed | 52 |
| Ex. 2 | Nitrogen | p-Doped | 4.9 | 1.0 | 9.5 | 0.7 | 2,200 | Not observed | 52 |
| Ex. 3 | Hydrogen | p-Doped | 4.4 | 1.0 | 9.6 | 0.7 | 2,200 | Not observed | 51 |
| Ex. 4 | Deuterium | p-Doped | 4.4 | 1.0 | 9.6 | 0.7 | 2,500 | Not observed | 51 |

Next, a 70 nm-thick cathode was formed on the electron-injection layer by depositing metallic aluminum via a patterned mask placed on the layer (the mask being patterned so that the formed light-emitting area becomes 2 mm×2 mm).

The thus-obtained laminate was placed in a glove box which had been purged with argon gas, and then was sealed in a stainless steel sealing can using a UV-ray curable adhesive (XNR5516HV, product of Nagase-CIBA Ltd.). Through the above procedure, an organic electroluminescence element of Comparative Example 9 was produced.

Comparative Example 10

The procedure of Comparative Example 9 was repeated, except that the hole-injection layer was doped with an electron-accepting dopant (F4TCQN) in an amount of 0.3% by mass with respect to the material of the hole-injection layer, to thereby produce an organic electroluminescence element of Comparative Example 10.

The p-doped hole-injection layer was formed through co-deposition of the hole-injection material and the electron-accepting dopant. The concentration of F4-TCNQ was adjusted to 0.3% by mass by setting the deposition rates of DNTPD and F4-TCNQ to 0.5 nm/s and 0.0015 nm/s, respectively.

Comparative Example 11

The procedure of Comparative Example 9 was repeated, except that the oxygen plasma treatment of the anode was not performed, to thereby produce an organic electroluminescence element of Comparative Example 11.

Comparative Example 12

The procedure of Comparative Example 10 was repeated, except that the oxygen plasma treatment of the anode was not performed, to thereby produce an organic electroluminescence element of Comparative Example 12.

Comparative Example 13

The procedure of Comparative Example 9 was repeated, except that a plasma treatment using argon gas was performed instead of the oxygen plasma treatment, to thereby produce an organic electroluminescence element of Comparative Example 13.

Comparative Example 14

The procedure of Comparative Example 9 was repeated, except that a plasma treatment using nitrogen gas was performed instead of the oxygen plasma treatment, to thereby produce an organic electroluminescence element of Comparative Example 14.

Comparative Example 15

The procedure of Comparative Example 9 was repeated, except that a plasma treatment using hydrogen gas was performed instead of the oxygen plasma treatment, to thereby produce an organic electroluminescence element of Comparative Example 15.

Comparative Example 16

The procedure of Comparative Example 9 was repeated, except that a plasma treatment using deuterium gas was performed instead of the oxygen plasma treatment, to thereby produce an organic electroluminescence element of Comparative Example 16.

Example 5

The procedure of Comparative Example 13 was repeated, except that the hole-injection layer was doped with an electron-accepting dopant (F4TCQN) in an amount of 0.3% by mass with respect to the material of the hole-injection layer, to thereby produce an organic electroluminescence element of Example 5.

Example 6

The procedure of Comparative Example 14 was repeated, except that the hole-injection layer was doped with an electron-accepting dopant (F4TCQN) in an amount of 0.3% by mass with respect to the material of the hole-injection layer, to thereby produce an organic electroluminescence element of Example 6.

Example 7

The procedure of Comparative Example 15 was repeated, except that the hole-injection layer was doped with an electron-accepting dopant (F4TCQN) in an amount of 0.3% by mass with respect to the material of the hole-injection layer, to thereby produce an organic electroluminescence element of Example 7.

Example 8

The procedure of Comparative Example 16 was repeated, except that the hole-injection layer was doped with an electron-accepting dopant (F4TCQN) in an amount of 0.3% by mass with respect to the material of the hole-injection layer, to thereby produce an organic electroluminescence element of Example 8.

Example 9

The procedure of Example 7 was repeated, except that the laminate of the glass substrate and the anode was subjected to the plasma treatment using hydrogen gas and then placed in a vacuum deposition apparatus without being exposed to air, to thereby produce an organic electroluminescence element of Example 9.

Example 10

The procedure of Example 8 was repeated, except that the laminate of the glass substrate and the anode was subjected to the plasma treatment using deuterium gas and then placed in a vacuum deposition apparatus without being exposed to air, to thereby produce an organic electroluminescence element of Example 10.

<Measurement Methods>

Similar to Comparative Examples 1 to 8 and Examples 1 to 4, each of the organic electroluminescence elements (phosphorescent light-emitting elements) of Comparative Examples 9 to 16 and Examples 5 to 10 was measured for work function of the electrode, EL quantum efficiency, drive voltage, increase in voltage during driving, durability, trace of short circuit, and the oxygen content of the electrode surface. The results are shown in Table 2 given below. The oxygen content of the electrode inside was found to be constant; i.e., 55 atomic % when treated in any treatment methods. Notably, in Comparative Examples 9 to 16 and Examples 5 to 10, the EL quantum efficiency, drive voltage and durability were measured under the same conditions as described above.

TABLE 2

| B | Plasma treatment | p-Doping | Work function (eV) | Quantum efficiency (%) | Drive voltage (V) | Increase in voltage (V) | Durability (h) | Trace of short circuit | O content (atomic %) |
|---|---|---|---|---|---|---|---|---|---|
| Comp. Ex. 9 | Oxygen | Not p-doped | 5.1 | 6.1 | 8.6 | 1.2 | 200 | Not observed | 56 |
| Comp. Ex. 10 | Oxygen | p-Doped | 5.1 | 6.0 | 7.9 | 0.5 | 400 | Not observed | 56 |
| Comp. Ex. 11 | Not performed | Not p-doped | 4.6 | 6.1 | 11.0 | 4.9 | 300 | Numerous | 55 |
| Comp. Ex. 12 | Not performed | p-Doped | 4.6 | 6.0 | 8.5 | 0.6 | 600 | Numerous | 55 |
| Comp. Ex. 13 | Argon | Not p-doped | 4.9 | 6.1 | 10.9 | 3.0 | 600 | Not observed | 52 |
| Comp. Ex. 14 | Nitrogen | Not p-doped | 4.9 | 6.1 | 11.0 | 3.0 | 600 | Not observed | 52 |
| Comp. Ex. 15 | Hydrogen | Not p-doped | 4.4 | 6.1 | 13.0 | 3.3 | 600 | Not observed | 51 |
| Comp. Ex. 16 | Deuterium | Not p-doped | 4.4 | 6.1 | 13.0 | 3.1 | 800 | Not observed | 51 |
| Ex. 5 | Argon | p-Doped | 4.9 | 6.0 | 8.0 | 0.7 | 900 | Not observed | 52 |
| Ex. 6 | Nitrogen | p-Doped | 4.9 | 6.0 | 8.0 | 0.7 | 900 | Not observed | 52 |
| Ex. 7 | Hydrogen | p-Doped | 4.4 | 6.0 | 8.1 | 0.7 | 900 | Not observed | 51 |
| Ex. 8 | Deuterium | p-Doped | 4.4 | 6.0 | 8.1 | 0.7 | 1,000 | Not observed | 51 |
| Ex. 9 | Hydrogen | p-Doped | 4.4 | 6.0 | 8.1 | 0.6 | 1,000 | Not observed | 50 |
| Ex. 10 | Deuterium | p-Doped | 4.4 | 6.0 | 8.1 | 0.6 | 1,100 | Not observed | 50 |

The method of the present invention for producing an organic electroluminescence element can produce an organic electroluminescence element whose drive voltage is low, the increase of which in voltage during driving is suppressed, and the decrease of which in durability due to oxidizing gas is suppressed. In particular, such advantageous effects can be remarkably obtained when an organic film is formed without being exposed to air after the surface treatment using a non-oxidizing gas. Specifically, the durability is improved by employing a surface treatment method of making the concentration of oxygen atoms in the surface lower than that in the inside by 3 atomic % or more. The organic electroluminescence element produced by the method can be suitably used in, for example, display elements, displays, backlights, electrophotography, illuminating light sources, recording light sources, exposing light sources, reading light sources, markers, signs, interior accessories and optical communication.

What is claimed is:

1. A method for producing an organic electroluminescence element, the method comprising: subjecting an anode to a surface treatment using at least one non-oxidizing gas, and co-depositing a hole-injection material and an electron-accepting dopant to form a p-doped hole-injection layer on a surface of the anode subjected to the surface treatment.

2. The method according to claim 1, wherein the surface treatment is a plasma treatment using a non-oxidizing gas selected from argon gas, nitrogen gas, hydrogen gas and deuterium gas.

3. The method according to claim 2, wherein the surface treatment is a plasma treatment using deuterium gas.

4. The method according to claim 1, wherein the forming the p doped hole-injection layer is forming a p-doped hole-injection layer on the surface of the anode without being exposed to air.

5. The method according to claim 1, wherein the oxygen content of an anode surface of the anode subjected to the surface treatment is lower than that of an anode inside thereof by 3 atomic % or more.

6. The method according to claim 1, wherein, in the forming the p-doped hole-injection layer, a hole-injection layer is doped with an electron-accepting dopant in an amount of 0.01% by mass to 50% by mass with respect to the material of the hole-injection layer.

7. The method according to claim 1, wherein the method further comprises: forming a light-emitting layer on the p-doped hole-injection layer.

* * * * *